US010222196B2

(12) United States Patent
Yamazaki et al.

(10) Patent No.: US 10,222,196 B2
(45) Date of Patent: Mar. 5, 2019

(54) ELECTRIC POWER SYSTEM MONITORING DEVICE AND ELECTRIC POWER SYSTEM MONITORING SYSTEM

(71) Applicant: Hitachi, Ltd., Chiyoda-ku, Tokyo (JP)

(72) Inventors: Jun Yamazaki, Tokyo (JP); Masahiro Yatsu, Tokyo (JP); Sumito Tobe, Tokyo (JP); Osamu Tomobe, Tokyo (JP); Tatsuki Inuduka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 30 days.

(21) Appl. No.: 15/511,341

(22) PCT Filed: May 28, 2015

(86) PCT No.: PCT/JP2015/065365
§ 371 (c)(1),
(2) Date: Mar. 15, 2017

(87) PCT Pub. No.: WO2016/047203
PCT Pub. Date: Mar. 31, 2016

(65) Prior Publication Data
US 2017/0292824 A1      Oct. 12, 2017

(30) Foreign Application Priority Data
Sep. 24, 2014   (JP) .................................. 2014-193905

(51) Int. Cl.
*G01B 7/14*       (2006.01)
*G01R 27/16*    (2006.01)
(Continued)

(52) U.S. Cl.
CPC ............... *G01B 7/14* (2013.01); *G01R 27/16* (2013.01); *G01R 31/40* (2013.01); *H02J 3/381* (2013.01);
(Continued)

(58) Field of Classification Search
CPC .......... G01B 7/14; G01R 27/16; G01R 31/40; G01R 31/025; H02J 13/002; H02J 3/383; H02J 3/386; H02J 3/461
(Continued)

(56) References Cited

U.S. PATENT DOCUMENTS

2013/0345999 A1   12/2013   Hafen et al.
2014/0049264 A1*  2/2014   Ganesh ................ G01R 31/025
                                                                              324/551

FOREIGN PATENT DOCUMENTS

JP    4-183235 A    6/1992
JP    6-133460 A    5/1994
(Continued)

OTHER PUBLICATIONS

Extended European Search Report issued in counterpart European Application No. 15844954.6 dated Apr. 4, 2018 (nine pages).
(Continued)

*Primary Examiner* — John H Le
(74) *Attorney, Agent, or Firm* — Crowell & Moring LLP

(57) ABSTRACT

The present invention monitors an electric power system using a time-series measurement value including abnormality. An electric power system monitoring device is provided with: a storage unit that stores facility information indicating a position relationship of a plurality of measurement sites in an electric power system; a reception unit that receives time-series measurement information measured by a measurement device disposed at each of the plurality of measurement sites; and a computation unit that acquires an electrical distance between the plurality of measurement sites on the basis of the facility information, classifies the plurality of measurement sites into at least one measurement site group on the basis of the electrical distance, extracts, with respect to each of the measurement sites in the measurement site group, a frequency component of electric
(Continued)

power fluctuation from the measurement information, selects, with respect to a first frequency component which is a frequency component of a first measurement site in the measurement site group, a second frequency component which is a frequency component of a second measurement site in the measurement site group, and calculates a similarity between the first frequency component and the second frequency component.

9 Claims, 12 Drawing Sheets

(51) Int. Cl.
*H02J 3/46* (2006.01)
*G01R 31/40* (2014.01)
*H02J 3/38* (2006.01)
*H02J 13/00* (2006.01)

(52) U.S. Cl.
CPC .............. *H02J 3/383* (2013.01); *H02J 3/386* (2013.01); *H02J 3/46* (2013.01); *H02J 13/002* (2013.01); *H02J 13/0079* (2013.01)

(58) Field of Classification Search
USPC ................................ 702/58, 60, 62; 324/551
See application file for complete search history.

(56) References Cited

FOREIGN PATENT DOCUMENTS

JP       10-56735 A     2/1998
JP       2012-124188 A  6/2012

OTHER PUBLICATIONS

Acar et al., "Framework for large-scale modeling and simulation of electricity systems for planning, monitoring, and secure operations of next-generation electricity grids", IBM Smarter Energy Research, Feb. 28, 2011, 73 pages, XP055114535.

International Search Report (PCT/ISA/210) issued in PCT Application No. PCT/US2015/065365 dated Jul. 21, 2015 with English translation (three (3) pages).

Japanese-language Written Opinion (PCT/ISA/237) issued in PCT Application No. PCT/US2015/065365 dated Jul. 21, 2015 (four (4) pages).

\* cited by examiner

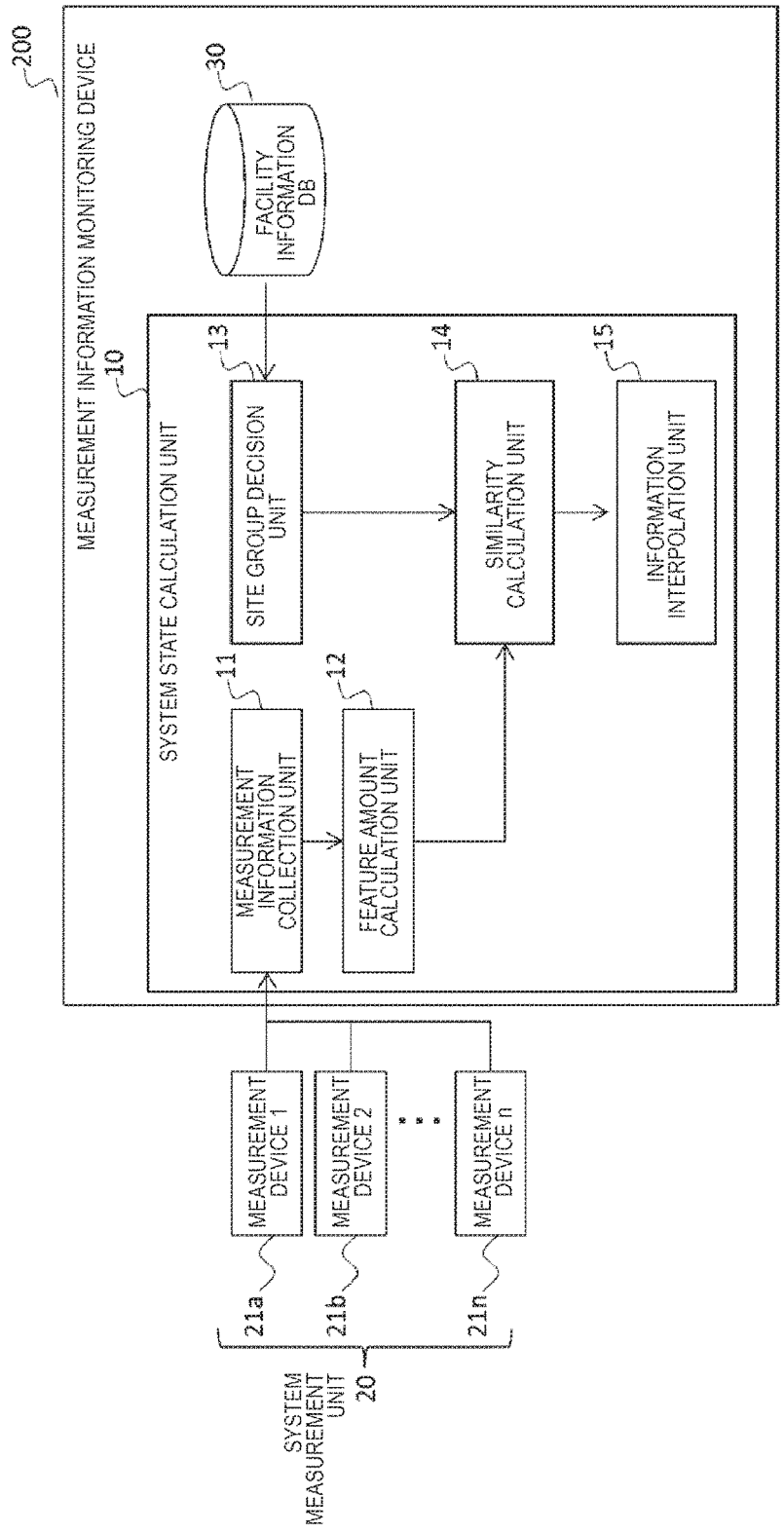
[Fig. 1]

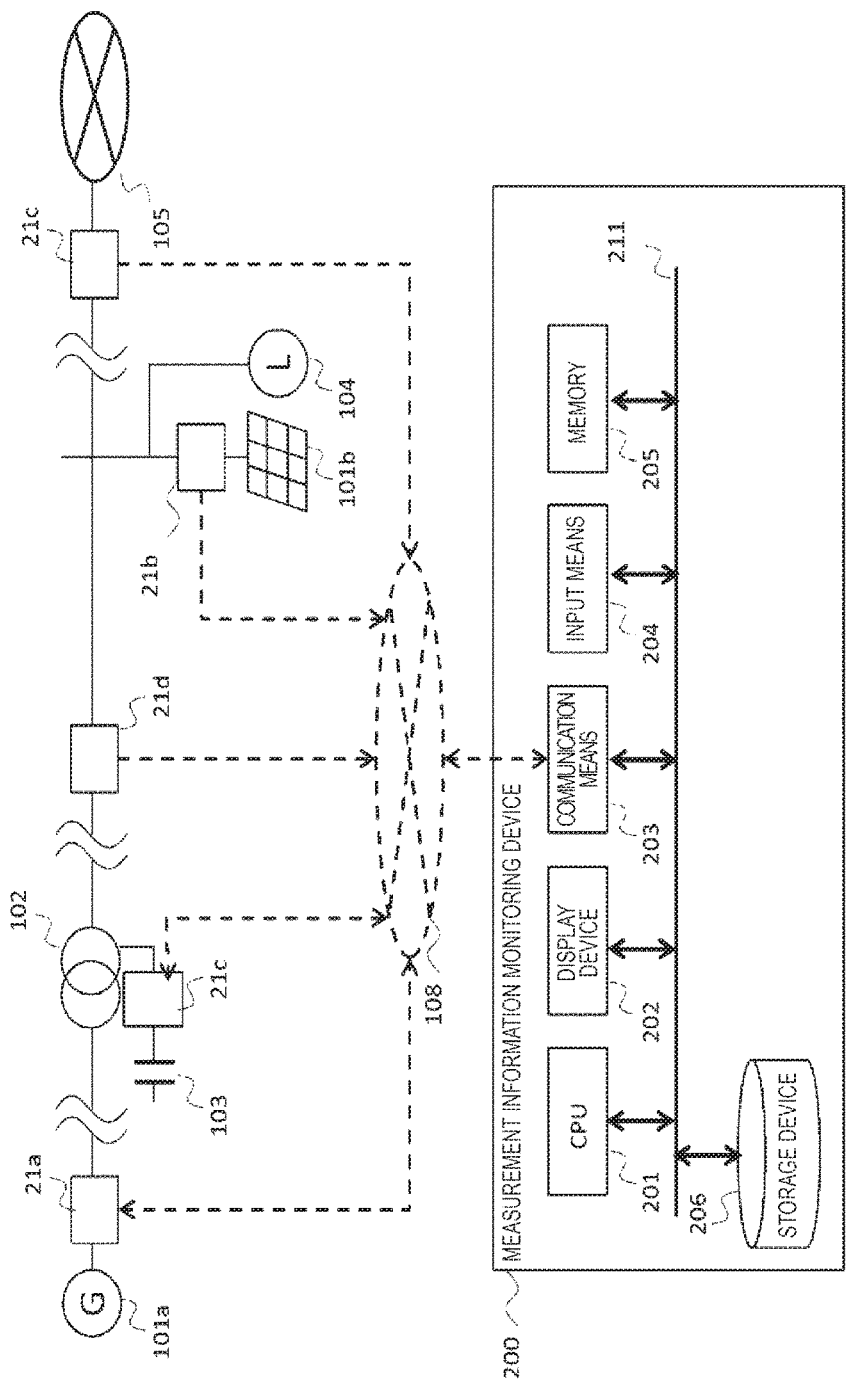

[Fig. 3]
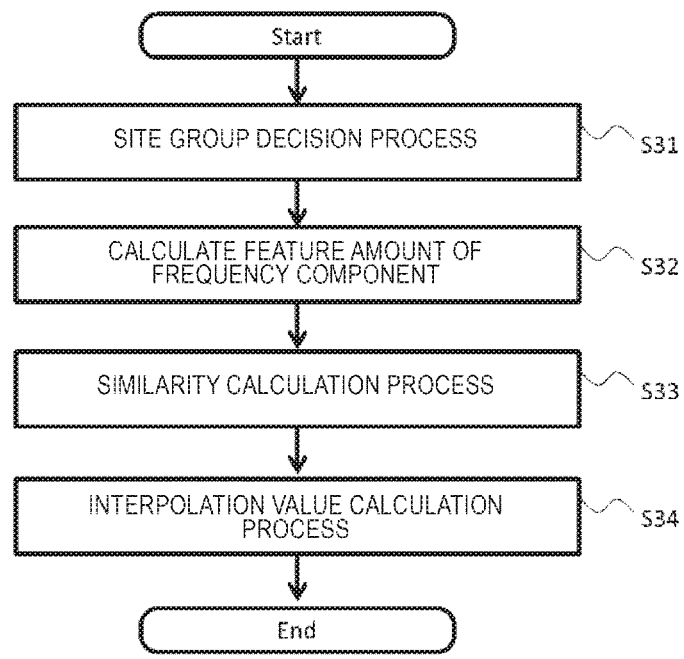

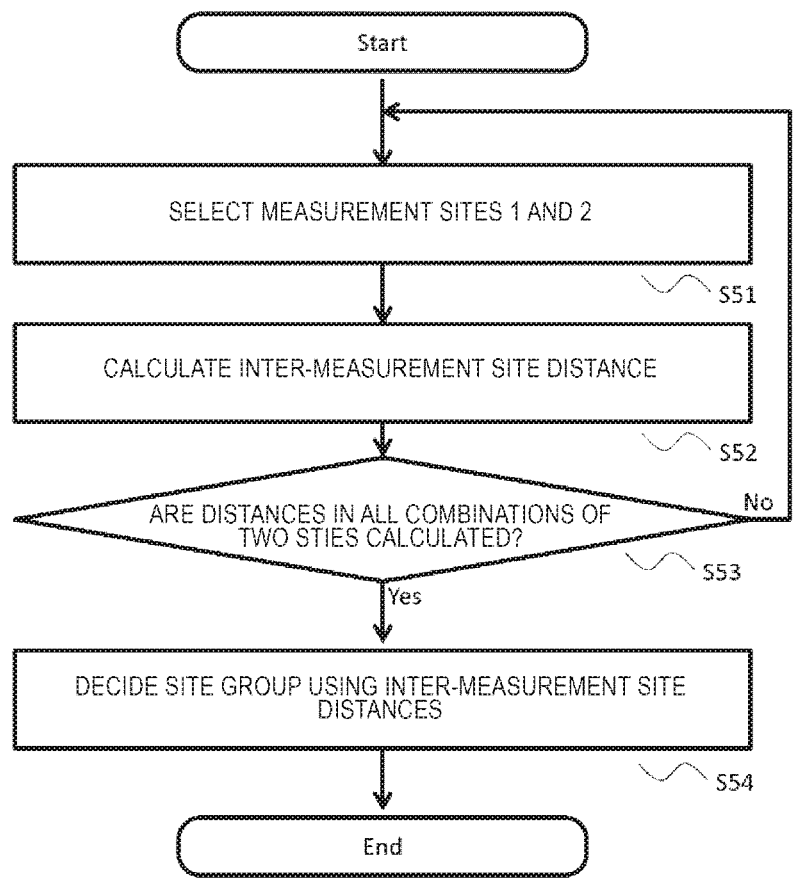
[Fig. 4]

[Fig. 5]

NODE INFORMATION

| NODE NAME | POSITION INFORMATION | | ELECTRIC POWER GENERATOR | | | LOAD | | | PHASE MODIFIER | | |
|---|---|---|---|---|---|---|---|---|---|---|---|
| | LATITUDE | LONGITUDE | NAME | TYPE | RATED CAPACITY | NAME | TYPE | RATED CAPACITY | NAME | TYPE | RATED CAPACITY |
| A | 36.5 | 138.2 | G1 | THERMAL POWER GENERATOR | 100 | — | — | — | — | — | — |
| B | 37.7 | 140.5 | G2 | WIND POWER GENERATOR | 200 | — | — | — | — | — | — |
| ... | ... | ... | ... | ... | ... | ... | ... | ... | ... | ... | ... |
| AA | 35.7 | 139.8 | — | — | — | L1 | HOUSE | 1000 | — | — | — |
| BB | 35.0 | 139.5 | — | — | — | L2 | FACTORY | 2000 | — | — | — |
| ... | ... | ... | ... | ... | ... | ... | ... | ... | ... | ... | ... |
| AAA | 36.3 | 139.0 | — | — | — | — | — | — | D1 | SC | 10 |
| BBB | 35.6 | 138.6 | — | — | — | — | — | — | D2 | ShR | 20 |
| ... | ... | ... | ... | ... | ... | ... | ... | ... | ... | ... | ... |

[Fig. 6]

POWER TRANSMISSION LINE INFORMATION

| POWER TRANSMISSION LINE NAME | BOTH-END NODES | | NORMAL PHASE RESISTANCE R | NORMAL PHASE REACTANCE X | NORMAL PHASE CAPACITANCE C |
|---|---|---|---|---|---|
| a | A | B | 0.01 | 0.2 | 0.1 |
| b | B | C | 0.02 | 0.5 | 0.2 |
| ⋮ | ⋮ | ⋮ | ⋮ | ⋮ | ⋮ |

[Fig. 7]

MEASUREMENT SITE INFORMATION

| MEASUREMENT SITE 1 | | MEASUREMENT SITE 2 | | INTER-MEASUREMENT SITE DISTANCE |
|---|---|---|---|---|
| MEASUREMENT SITE NAME | NODE NAME | MEASUREMENT SITE NAME | NODE NAME | |
| PMU1 | A | PMU2 | B | 15 |
| PMU1 | A | PMU3 | C | 40 |
| ⋮ | ⋮ | ⋮ | ⋮ | ⋮ |

[Fig. 8]

MEASUREMENT INFORMATION

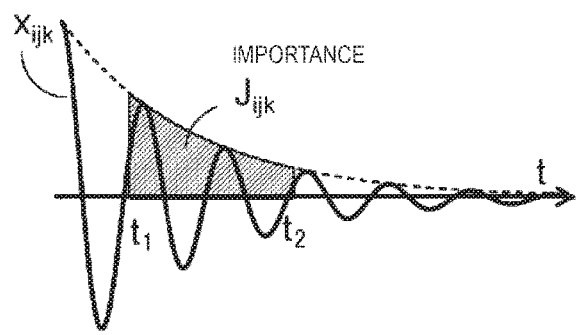

[Fig. 9]
FLUCTUATION INFORMATION TABLE
| FLUCTUATION NAME | | FLUCTUATION FREQUENCY | ATTENUATION COEFFICIENT | AMPLITUDE | INITIAL PHASE | IMPORTANCE |
|---|---|---|---|---|---|---|
| MEASUREMENT SITE | No. | | | | | |
| PMU1 | 1 | 0.18 | −2.0 | 120 | 10 | 100 |
| | 2 | 0.65 | −0.5 | 80 | 30 | 45 |
| | ⋮ | ⋮ | ⋮ | ⋮ | ⋮ | ⋮ |
| PMU2 | 1 | 0.19 | −1.9 | 90 | 15 | 80 |
| ⋮ | ⋮ | ⋮ | ⋮ | ⋮ | ⋮ | ⋮ |
[Fig. 10]
SIMILARITY CALCULATION PROCESS
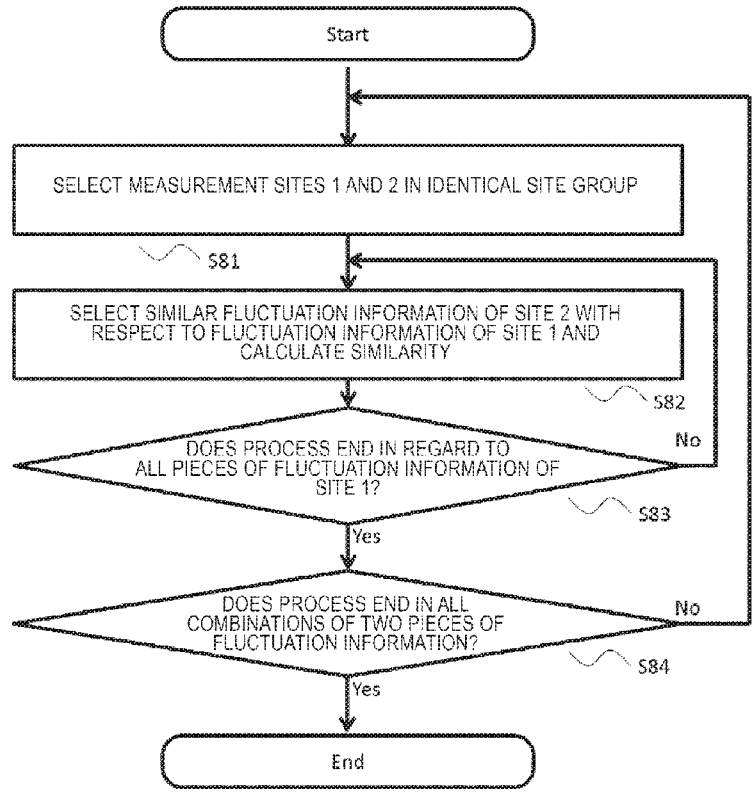

[Fig. 11]

SIMILARITY TABLE

| MEASUREMENT SITE | No. | SITE 1 | | | | MEASUREMENT SITE | No. | SITE 2 | | | | SIMILARITY |
| --- | --- | --- | --- | --- | --- | --- | --- | --- | --- | --- | --- | --- |
| | | FLUCTUATION FREQUENCY | ATTENUATION COEFFICIENT | AMPLITUDE | INITIAL PHASE | | | FLUCTUATION FREQUENCY | ATTENUATION COEFFICIENT | AMPLITUDE | INITIAL PHASE | |
| PMU1 | 1 | 0.18 | -2.0 | 120 | 10 | PMU2 | 1 | 0.19(+0.01) | -1.9(+0.1) | 90(-30) | 15(+5) | 180 |
| | | | | | | PMU3 | 1 | 0.18(+0) | -2.1(-0.1) | 150(+30) | 30(+20) | 160 |
| | | | | | | ... | ... | ... | ... | ... | ... | ... |
| PMU1 | 2 | 0.65 | -0.5 | 80 | 30 | PMU2 | 3 | 0.65(+0) | -0.5(+0) | 90(-10) | -30(-60) | 90 |
| | | | | | | PMU3 | - | - | - | - | - | 0 |
| ... | ... | ... | ... | ... | ... | ... | ... | ... | ... | ... | ... | ... |

[Fig. 12]
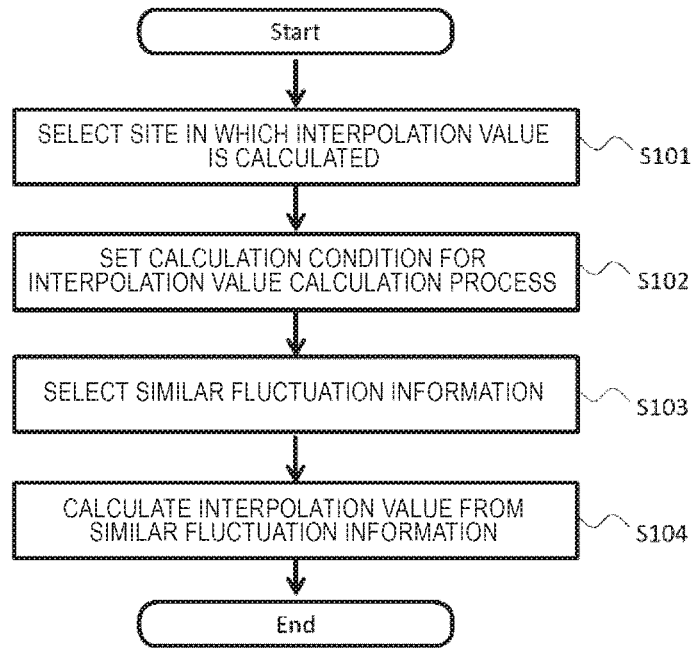

[Fig. 13]
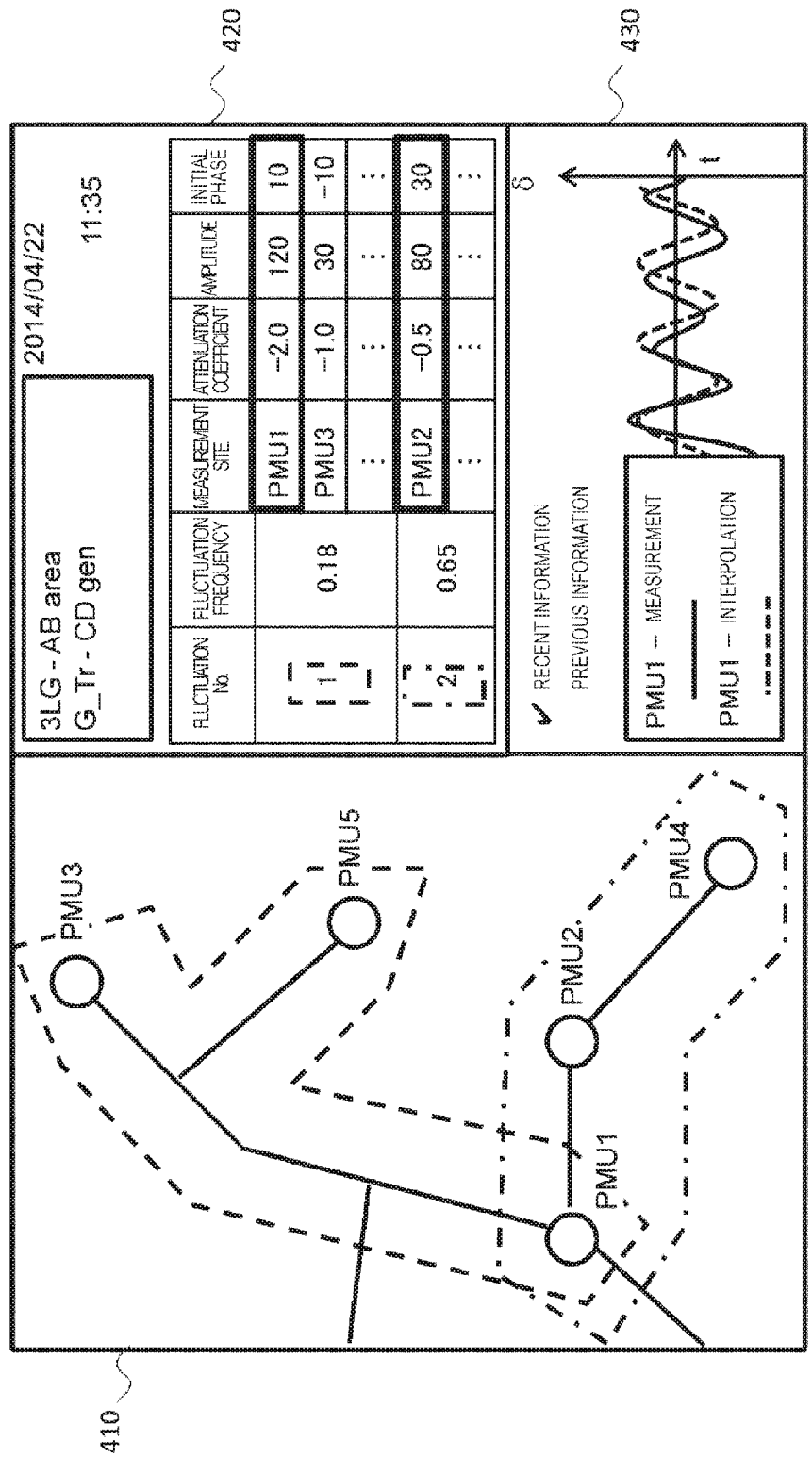

[Fig. 14]

PREVIOUS FLUCTUATION INFORMATION TABLE

| CASE No. | CASE DETAILS | | | | FLUCTUATION No. | FLUCTUATION FREQUENCY | IMPORTANCE | MEASUREMENT SITE | ATTENUATION COEFFICIENT | AMPLITUDE | INITIAL PHASE |
|---|---|---|---|---|---|---|---|---|---|---|---|
| | TIME | DAY OR DAY OF WEEK | MONTH OR SEASON | EVENT | | | | | | | |
| 1 | 8:00 – 10:00 | SAT–SUN | MARCH TO MAY | NO EVENT | 1-1 | 0.18 | 180 | PMU1 | -2.0 | 120 | 10 |
| | | | | | | | | PMU3 | -1.0 | 30 | -10 |
| | | | | | | | | ... | ... | ... | ... |
| | | | | | 1-2 | 0.65 | 160 | PMU2 | -0.5 | 80 | 30 |
| | | | | | | | | ... | ... | ... | ... |
| | | | | | 1-3 | 0.18 | 100 | PMU2 | -1.9 | 90 | 15 |
| | | | | | ... | | | ... | ... | ... | ... |
| 2 | 12:00 – 14:00 | MON–FRI | JULY TO SEPTEMBER | NODE AA 1LG | 2-1 | 0.35 | 260 | PMU2 | -0.3 | 90 | 20 |
| | | | | | | | | PMU3 | -0.5 | 60 | 30 |
| | | | | | | | | ... | ... | ... | ... |
| | | | | | 2-2 | 0.18 | 160 | PMU3 | -1.0 | 70 | 20 |
| | | | | | ... | | | ... | ... | ... | ... |
| ... | ... | ... | ... | ... | ... | | | | | | |

[Fig. 15]
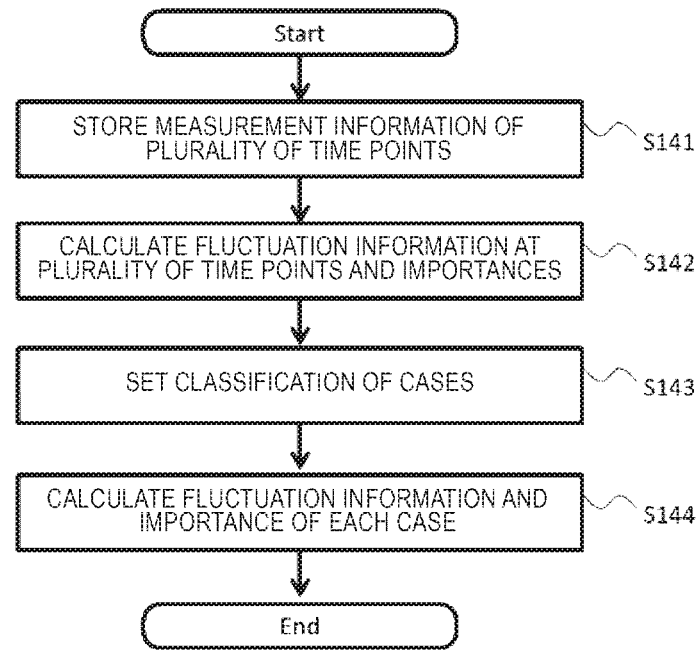

ELECTRIC POWER SYSTEM MONITORING DEVICE AND ELECTRIC POWER SYSTEM MONITORING SYSTEM

TECHNICAL FIELD

The present invention relates to an electric power system monitoring device.

BACKGROUND ART

A power system is configured with many generators, a load, a transmission and distribution device, and a control device. In a normal state, minute disturbance caused due to a variation in a load or switch of a system is added to an electric power system. When an accident such as a ground fault or short-circuit of a system occurs, large disturbance is added to an electric power system. Electric power fluctuation having a plurality of fluctuation components occurs due to such disturbance.

In a case in which the fluctuation mode component is small or is attenuated at a high speed, system fluctuation is maintained in a sufficiently small range after the occurrence of the disturbance. Therefore, the electric power system is in a stable state. However, in a case in which the fluctuation increases or the attenuation continues or diverges without convergence, an electric power generator consequently stops or a wide-area power failure occurs, and thus there is a possibility of a stable operation being unfeasible.

With expansion of an electric power system scale, there is a tendency that an electric capacity increases, a remote area is distant, maldistribution increases, power transmission lines increase with the maldistribution, and double-flow progresses. Since an influence of such changes is exerted in a direction in which stability of a power system deteriorates, there is a concern of a successive influence expanding to large-scale power falling and wide-area power failure originating due to step-out of an electric power generator at the time of breakdown of the system.

Therefore, an online system stability evaluation method of previously preventing and predicting involvement in the wide-area power failure by normally monitoring stability of the system is necessary.

In recent years, a phase detector PMU (Phasor Measurement Unit) measuring a bus voltage phase angle of an electric power system in substantially real time by performing synchronization measurement using the global positioning system (GPS) has spread. A power fluctuation phenomenon can be ascertained in real time using an online measurement value such as a system bus voltage measured by the phase detector PMU.

However, a deficient value or an abnormal value is included in a PMU measurement value due to a measurement device failure, communication delay, or the like. There is a possibility that a monitoring result deviated from an actual system state is output as a system state monitoring result obtained using the PMU measurement value including a deficient value or an abnormal value. When a control policy of the power system is decided using an inaccurate state monitoring result, unnecessary control is performed or stability of a system deteriorates as a result, and thus there is a possibility of a large-scale power failure being involved.

In regard to the foregoing problems, state estimation has been known. For example, PTL 1 discloses "a power system calculator system monitoring and controlling an electric power system and including: a collection unit that collects data of each unit of the electric power system; a state estimation unit that estimates magnitudes and phase angles of all the bus voltages of the electric power system which are most probable on the basis of the collected data and requests any one of an effective or ineffective electric power flow of an entire system, an effective or ineffective power injection amount of the entire system, and apparent power on the basis of the estimated magnitudes and phase angles of the bus voltages; a system monitoring processing unit that monitors an electric power system state on the basis of estimation result data in the state estimation unit and stores the electric power system state in an online database; and various processing functions of performing various processes using data stored in the online database".

CITATION LIST

Patent Literature

PTL 1: JP-A-4-183235

SUMMARY OF INVENTION

Technical Problem

In recent years, renewable energy generated by representative solar photoelectric generation or wind power generation is massively introduced to systems. With a power generation output variation of such renewable energy which is steep and difficult to assume beforehand, there is a possibility of system features being considerably changed as a result. For example, in a case in which a wind speed exceeds a certain threshold, an operation of automatically stopping wind power generation and cutting out a power generation output to zero arises in order to maintain device safety occurs. Such an event occurs more frequently than short-circuit or a ground fault also occurring in a system of the related art. In a case in which electric power generators are densely installed in a near district, it is expected that there is a high possibility of such an event simultaneously occurring in a plurality of electric power generators.

With electricity liberalization and separation of electrical power production from transmission, many electric power generators and system control devices owned and managed by a plurality of business entities are connected to electric power systems.

With an increase in a renewable energy introduction amount and a progress of power liberalization, a power generation output variation which is difficult to assume beforehand and an occurrence frequency of a change in a system configuration increase, and thus it is expected that it is difficult to ascertain a system state.

A deficient value or an abnormal value is considered to be interpolated by applying state estimation by inputting measurement values including the deficient value or the abnormal value in a plurality of measurement sites. However, since it is assumed that the system state is ascertained accurately in real time in the state estimation, the deficient value or the abnormal value included in PMU measurement values may not be corrected in a situation in which it is difficult to ascertain the system state.

An object of the invention is to monitor an electric power system using a time-series measurement value containing abnormality.

Solution to Problem

To resolve the foregoing problems, according to an aspect of the invention, there is provided an electric power system monitoring device that monitors an electric power system state and includes: a storage unit that stores facility information indicating a position relationship of a plurality of measurement sites in the electric power system; a reception unit that receives time-series measurement information measured by a measurement device disposed at each of the plurality of measurement sites; and a computation unit that acquires an electrical distance between the plurality of measurement sites on the basis of the facility information, classifies the plurality of measurement sites into at least one measurement site group on the basis of the electrical distance, extracts a frequency component of electric power fluctuation from the measurement information with respect to each of the measurement sites in the measurement site group, selects a second frequency component which is a frequency component of a second measurement site in the measurement site group with respect to a first frequency component which is a frequency component of a first measurement site in the measurement site group, and calculates a similarity between the first frequency component and the second frequency component.

BRIEF DESCRIPTION OF DRAWINGS

FIG. 1 is a diagram illustrating a functional configuration of a measurement information monitoring device according to an embodiment.

FIG. 2 is a diagram illustrating a configuration of a measurement information monitoring system according to the embodiment.

FIG. 3 is a diagram illustrating an information interpolation process.

FIG. 4 is a diagram illustrating a site group decision process.

FIG. 5 is a diagram illustrating node information.

FIG. 6 is a diagram illustrating power transmission line information.

FIG. 7 is a diagram illustrating measurement site information.

FIG. 8 is a diagram illustrating concept of an importance.

FIG. 9 is a diagram illustrating a feature amount information table.

FIG. 10 is a diagram illustrating a similarity calculation process.

FIG. 11 is a diagram illustrating a similarity table.

FIG. 12 is a diagram illustrating an interpolation value calculation process.

FIG. 13 is a diagram illustrating a display screen.

FIG. 14 is a diagram illustrating a previous fluctuation information table.

FIG. 15 is a diagram illustrating a previous fluctuation information calculation process.

DESCRIPTION OF EMBODIMENTS

Hereinafter, preferred embodiments of the invention will be described. The following embodiments are merely examples of embodiments and the invention is not intended as being limited to the following specific content.

FIG. 1 is a diagram illustrating a functional configuration of a measurement information monitoring device according to an embodiment.

A measurement information monitoring device 200 according to the embodiment includes a system state calculation unit 10 and an information storage unit 30. The system state calculation unit 10 is connected to a system measurement unit 20. The system measurement unit 20 measures measurement information regarding a plurality of sites. The information storage unit 30 stores facility information database (DB).

Hereinafter, in a case in which it is not necessary to distinguish elements from each other by alphabets reference numerals, the alphabets reference numerals are omitted in some cases.

The system state calculation unit 10 includes a measurement information collection unit 11, a feature amount calculation unit 12, a site group decision unit 13, a similarity calculation unit 14, and an information interpolation unit 15.

The measurement information collection unit 11 receives and collects measurement information (system state amount) measured by the system measurement unit 20 via an information communication network.

The system measurement unit 20 measures measurement information in a measurement site in a system and transmits the measurement information to the measurement information collection unit 11. The measurement information includes at least one type of measurement among effective power flow, ineffective power flow, a system voltage, a system current, and a voltage phase. The system measurement unit 20 includes measurement devices 21a, 21b, ..., and 21n disposed in the plurality of measurement sites, respectively. The measurement devices 21 are, for example, PMUs, perform periodic measurement of power, and transmit time-series measurement information.

The information storage unit 30 stores the facility information DB indicating connection information regarding system elements linked to an electric power system. The facility information DB includes any of information indicating characteristics of a system element (electric power device) connected to each node in a system such as an electric power generator, a load, and a phase modifier linked to the vicinity of the measurement site, information indicating impedance or the like of a power transmission line connecting nodes to each other, and information indicating a position relationship such as latitudes and a longitudes or topologies of the plurality of measurement sites. Thus, the site group decision unit 13 can calculate an electrical distance between the measurement sites and classify the measurement sites according to the electrical distance.

On the basis of the measurement information collected by the measurement information collection unit 11, the feature amount calculation unit 12 calculates fluctuation information indicating a feature amount of a frequency component of electric power fluctuation included in the time-series measurement information in the measurement site in regard to a specific type of measurement information (measurement type).

The site group decision unit 13 acquires the electrical distance between the plurality of measurement sites on the basis of the facility information DB and classifies the plurality of measurement sites into at least one site group (measurement site group) on the basis of the electrical distance. For example, the site group decision unit 13 recognizes two measurement sites as one measurement site group when the electrical distance between the two measurement sites is close, and recognizes two measurement sites as two measurement site groups when the electrical distance between the two measurement sites is distant.

The similarity calculation unit 14 calculates a similarity between the measurement sites in the measurement site group in regard to the plurality of measurement sites extracted by the site group decision unit 13 on the basis of the fluctuation information calculated from the time-series measurement information by the feature amount calculation unit 12.

The information interpolation unit 15 interpolates a deficient value or an abnormal value included in the time-series measurement information on the basis of the similarity calculated by the similarity calculation unit 14.

FIG. 2 is a diagram illustrating a configuration of a measurement information monitoring system according to the embodiment.

As illustrated in FIG. 2, the measurement information monitoring system according to the embodiment includes an electric power generator 101, an electric power substation 102, a phase modifier 103, an electric power load 104, an external electric power system 105, the measurement devices 21a, 21b, . . . , an information communication network 108, and a measurement information monitoring device 200. Hereinafter, an electric power system including the electric power generator 101, the electric power substation 102, the phase modifier 103, the electric power load 104, and the measurement devices 21a, 21b, . . . is referred to as a self-system in some cases.

The electric power generator 101 is an electric power generator that generates an electric power according to any electric power generation method of thermal power generation, hydroelectric power generation, nuclear power generation, solar photoelectric generation, wind power generation, biomass power generation, and tidal power generation. An electric power generator 101a is a large sized electric power generator including thermal power generation, hydroelectric power generation, and nuclear power generation installed on a high-voltage side of the electric power substation 102 in the electric power system and transmits a system state amount including an electric power amount to the measurement information monitoring device 200 via the measurement device 21a and the information communication network 108. The electric power generator 101a receives control instruction information transmitted from the measurement information monitoring device 200 via the measurement device 21a and the information communication network 108 and changes a system state amount including the electric power amount according to the control instruction information. An electric power generator 101b is a medium or small sized electric power generator including solar photoelectric generation, wind power generation, and cogeneration installed on a low-voltage side of the electric power substation 102 in the electric power system and transmits a system state amount including an electric power amount to the measurement information monitoring device 200 via the measurement device 21b and the information communication network 108.

The electric power substation 102 is installed between power transmission lines in the electric power system, changes a voltage value of electric power transmitted from the high-voltage side on which the electric power generator 101a which is a large sized electric power generator is installed, and transmits the power to a low-voltage side on which the electric power load 104 is installed. The phase modifier 103 such as an electric power capacitor or a shunt reactor is connected to the electric power substation 102.

The phase modifier 103 is a device that controls a voltage distribution in the electric power system by changing ineffective electric power in the electric power system and includes an electric power capacitor, shunt reactor, a static synchronous compensator (STATCOM: a self-excited reactive power compensator), and a static var compensator (SVC: static reactive power compensator). Some of the phase modifiers 103 receives the control instruction information transmitted from the measurement information monitoring device 200 via the measurement device 21c and the information communication network 108 and changes a system state amount including an electric power amount according to the control instruction information.

The electric power load 104 is a facility including an electric motor or light equipment that consumes electric power and indicates a facility such as a house, a factory, or a building.

The external electric power system 105 is an external electric power system which may not be controlled from the measurement information monitoring device 200 and is connected to the self-system by an interconnection.

The measurement devices 21a, 21b, . . . each include a sensor that measures a system state amount such as an electric generation amount in the electric power generator 101a, a phase amount in the phase modifiers 103, or a flow value or a voltage value in a power transmission line and transmits the measured system state amount to the measurement information monitoring device 200 via the information communication network 108.

The information communication network 108 is a network that can transmit data in both directions. The information communication network 108 is, for example, a wired network, a wireless network, or a combination thereof. The information communication network 108 may be the so-called Internet or a dedicated line network.

The measurement information monitoring device 200 is a device that realizes a measurement information monitoring function illustrated in FIG. 1. The measurement information monitoring device 200 receives the system state amount measured in each of the measurement devices 21a, 21b, . . . via the information communication network 108. In addition, the measurement information monitoring device 200 transmits the transmitted system state amount of the system and the control instruction information calculated using information accumulated therein to the measurement device 21 via the information communication network 108.

In the internal configuration of the measurement information monitoring device 200, a central processing unit (CPU) 201, a display device 202, communication means 203, input means 204, a memory 205, and a storage device 206 are connected to a bus line 211. The CPU 201 executes a calculation program stored in the storage device 206, performs calculation of a system state, generation of a control signal, or generation of image data, and causes the display device 202 to display the image data. The memory 205 is a memory that temporarily stores display image data, calculation result data of the system state, or the like and is, for example, a random access memory (RAM). The communication means 203 acquires a system state amount such as a flow value or a voltage value from the measurement device 21 via the information communication network 108. The measurement information collection unit 11 receives time-series measurement information measured by the plurality of measurement devices 21 using the communication means 203.

An operator (a user or a manger) of the measurement information monitoring device 200 can set or change parameters such as various thresholds via a predetermined interface of the input means 204 and can appropriately set an operation of the measurement information monitoring device 200 of the self-system. The operator can select a kind of data desired to be confirmed via the predetermined interface of the input means 204 and can cause the display device 202 to display the data.

The storage device 206 retains various programs and data. The storage device 206 is, for example, a hard disk drive (HDD) or a flash memory. For example, the storage device 206 retains programs and data for realizing various functions to be described below. The programs and the data stored in the storage device 206 are read and executed by the CPU 201, as necessary. Also, the storage device 206 realizes the information storage unit 30 and stores various databases (DBs).

Here, an information interpolation process by the measurement information monitoring device 200 will be described.

FIG. 3 is a diagram illustrating an information interpolation process.

First, the site group decision unit 13 performs a site group decision process of deciding a site group at the plurality of measurement sites using the facility information DB stored in the information storage unit 30 (S31).

Here, a site group decision process will be described.

FIG. 4 is a diagram illustrating a site group decision process.

The site group decision unit 13 selects two measurement sites in order from the measurement site of the measurement information acquired by the measurement information collection unit 11 (S51).

Next, an inter-site distance between the two measurement sties (measurement sites 1 and 2) selected in S51 is calculated on the basis of the facility information DB stored in the information storage unit 30 (S52).

The facility information DB includes node information, power transmission line information, and measurement site information.

FIG. 5 is a diagram illustrating node information.

The node information includes a node name for identifying a node, position information indicating the position of the node, and characteristics of an electric power generator, an electric power load, and a phase modifier connected to the node for each node in the electric power system. In the example of the drawing, an electric power generator is linked to nodes A and B. A thermal power generator that has a name G1 and has a rated capacity of 100 is linked to the node A and a wind power generator that has a name G2 and has a rated capacity of 200 is linked to the node B. In the example of the drawing, an electric power load is linked to nodes AA and BB. A house which has a name L1 and has a rated capacity of 1000 is linked to the node AA and a factory which has a name L2 and has a rated capacity of 2000 is linked to the node BB. In the example of the drawing, the phase modifier is linked to nodes AAA and BBB. A static condenser (SC: power capacitor) which has a name D1 and has a rated capacity of 10 is linked to the node AAA and a shunt reactor (ShR) which has a name D2 and a rated capacity of 20 is linked to the node BBB.

FIG. 6 is a diagram illustrating power transmission line information.

The power transmission line information includes a power transmission line name for identifying a power transmission line, both-end nodes indicating nodes at both ends of the power transmission line, and a normal phase resistance, a normal phase reactance, and a normal phase capacitance of the power transmission line for each power transmission line in the electric power system. In the example of the drawing, a power transmission line a is present between nodes A and B. The normal phase resistance, the normal phase reactance, and the normal phase capacitance of the power transmission line a are 0.01, 0.2, and 0.1, respectively.

FIG. 7 is a diagram illustrating measurement site information.

The measurement site information includes identification information regarding two measurement sites and an inter-measurement site distance between the two measurement sites for each measurement site in the electric power system. The measurement sites indicate sites in which measurement devices 21a, 21b, . . . are connected. In the example of the drawing, the identification information regarding the measurement site includes a measurement site name indicating the measurement device 21 and a node name included in the node information. A measurement site which has a measurement site name PMU1 is connected to the node A and a measurement site which has a measurement site name PMU2 is connected to the node B. The inter-measurement distance is a value calculated on the basis of an electrical distance between two measurement sites and system elements such as an electric power generator, an electric power load, and a phase modifier linked to the vicinities of the two measurement sites. For example, an inter-measurement site distance D is calculated by the following (Equation 14).

$$D = \alpha d + \sum_{i=1}^{n} \beta_i C_i \qquad \text{Equation 1}$$

Here, D indicates an electrical distance proportional to impedance between two measurement sites. Further, n indicates the number of system elements such as an electric power generator, an electric power load, and a phase modifier linked from one of the two measurement sites within the range of an electrical distance decided with a certain threshold. $\alpha$, $\beta_i$ indicates a rated capacity of an i-th system element linked from one of the two measurement sites within the range of the electrical distance decided with the certain threshold. $\alpha$, $\beta_i$ indicate coefficients. By using an electrical distance between the two measurement sites, it is possible to determine whether fluctuation components of the two measurement sites are the same as each other.

Data configuration of the facility information DB illustrated in the drawing is an example. The information storage unit 30 may store further detailed facility information. For example, the node information may include electric power generator activation characteristics such as a governor constant as information regarding a node to which a thermal power generator is linked. The node information may include stochastic generation amount variation characteristics calculated through statistical analysis using a previous history as information regarding a node to which an electric power generator is linked in accordance with natural energy of a wind power generator or the like. In calculation of the inter-measurement site distance in the measurement site information, the site group decision unit 13 may decide the coefficient $\beta_i$ of (Equation 1) on the basis of the foregoing electric power generation activation characteristics. The site group decision unit 13 may calculate a distance between the measurement sites not using information regarding impedance or system elements such as an electric power generator, an electric power load, and a phase modifier but using latitude and longitude information included in the node information and may set its value as an inter-measurement site distance D.

Here, the description will return to the site group decision process.

Next, the site group decision unit 13 determines whether the inter-measurement site distance is calculated in all combinations of two sites in regard to the measurement sites of the measurement information acquired by the measurement information collection unit 11 (S53). In a case in which there are the combinations of the measurement sites for which the inter-measurement site distance is not calculated (No), the site group decision unit 13 repeats S51, S52, and S53 in regard to the others of the two measurement sites. In a case in which the site group decision unit 13 determines that the inter-measurement site distance in regard to all of combinations of the two sites is calculated (Yes), the site group decision unit 13 decides a site group using the calculated inter-measurement site distance (S54), and then this flow ends. For example, the site group decision unit 13 classifies the measurement sites into clusters using the inter-measurement site distance in accordance with a clustering method typified by a nearest neighbor method, a Ward method, a k-means method, or a vector quantization method and decides each of the obtained clusters as a site group.

Here, the description will return to the information interpolation process.

After S31, the feature amount calculation unit 12 calculates a feature amount of a frequency component in each of the pieces of time-series measurement information of the plurality of measurement sites measured by the system measurement unit 20 as fluctuation information (S32). Here, the measurement information of the plurality of measurement sites measured by the system measurement unit 20 includes information regarding at least one type of measurement among effective power flow, ineffective power flow, a system voltage, a system current, and a voltage phase. A fluctuation frequency, an attenuation coefficient, an amplitude, an initial phase may be used as a feature amount. The measurement information monitoring device 200 may perform a measurement information determination process on one specific type of measurement or may perform the measurement information determination process on the plurality of types of measurement. In the present process, the feature amount calculation unit 12 applies an algorithm used for frequency analysis, that is, at least one of the algorithms such as Fourier analysis, wavelet analysis, a prony method, a matrix pencil method, and a Hankel total least squares (HTLS) method.

Hereinafter, a fluctuation information calculation algorithm according to the prony method will be described.

A number-of-data N and a mode order n of an analysis window width are set preliminarily.

The feature amount calculation unit 12 calculates a matrix $a=(a_1, a_2, \ldots, a_n)^T$ from the following (Equation 2) to (Equation 5) using input data y(k) (where k=0, 1, . . . , and N−1) which is measurement information of each site. Here, a superscript "T" indicates a transposed matrix and a superscript "−1" is an inverse matrix.

$$a = (X^T X)^{-1} X^T y \qquad \text{Equation 2}$$

$$a = \begin{bmatrix} a_1 \\ a_2 \\ \vdots \\ a_n \end{bmatrix} \qquad \text{Equation 3}$$

$$X = \begin{bmatrix} y(n-1) & y(n-2) & \cdots & y(0) \\ y(n) & y(n-1) & \cdots & y(1) \\ \vdots & \vdots & \ddots & \vdots \\ y(N-2) & y(N-3) & \cdots & y(N-n-1) \end{bmatrix} \qquad \text{Equation 4}$$

$$y = \begin{bmatrix} y(n) \\ y(n+1) \\ \vdots \\ y(N-1) \end{bmatrix} \qquad \text{Equation 5}$$

The feature amount calculation unit 12 substitutes the calculated $a_1, a_2, \ldots,$ and $a_n$ to the following (Equation 6) from the (Equation 2) to (Equation 5). Thereafter, the feature amount calculation unit 12 substitutes $Z_i$ expressed in forms of (Equation 7) and (Equation 8) to Z of (Equation 6) to calculate an eigenvalue $\lambda_i$, an attenuation coefficient (attenuation ratio) $\sigma_i$ [1/sec], and a fluctuation frequency $f_i$ [Hz]= $\omega_i/2\pi$. Here, $\Delta t$ indicates a sampling period.

(Equation 6) is a polynomial of degree n (characteristic equation) in which $Z_i$ is a solution. Here, n $Z_i$, $\sigma_i$, and $f_i$ are sought as resolutions.

$$Z^n - (a_1 Z^{n-1} + a_2 Z^{n-2} + \ldots + a_n Z^0) = 0 \qquad \text{Equation 6}$$

$$Z_i = \exp(\lambda_i \Delta t) \qquad \text{Equation 7}$$

$$\lambda_i = \sigma_i + \omega_i j \qquad \text{Equation 8}$$

The feature amount calculation unit 12 calculates a matrix $b=(B_1, B_2, \ldots,$ and $B_n)^T$ from the following (Equation 9) to (Equation 12) using input data y(k) (where k=0, 1, . . . , and N−1) and the calculated $Z_i$ (where i=1, 2, . . . , and n).

$$b = (Z^T Z)^{-1} Z^T w \qquad \text{Equation 9}$$

$$b = \begin{bmatrix} B_1 \\ B_2 \\ \vdots \\ B_n \end{bmatrix} \qquad \text{Equation 10}$$

$$Z = \begin{bmatrix} Z_1^0 & Z_2^0 & \cdots & Z_n^0 \\ Z_1^1 & Z_2^1 & \cdots & Z_n^1 \\ \vdots & \vdots & \ddots & \vdots \\ Z_1^{N-1} & Z_2^{N-1} & \cdots & Z_n^{N-1} \end{bmatrix} \qquad \text{Equation 11}$$

$$w = \begin{bmatrix} y(0) \\ y(1) \\ \vdots \\ y(N-1) \end{bmatrix} \qquad \text{Equation 12}$$

The feature amount calculation unit 12 seeks for an absolute value $R_i$ and a deflection angle $\theta_i$ expressed in (Equation 12) from $B_1, B_2, \ldots,$ and $B_n$ calculated from (Equation 9) to (Equation 12). At this time, the absolute value $R_i$ means an amplitude and the deflection angle $\theta_i$ means an initial phase.

$$B_i = R_i \exp(j\theta_i) \qquad \text{Equation 13}$$

Through the foregoing process, fluctuation information including the fluctuation frequency, the attenuation coefficient, the amplitude, and the initial phase can be obtained. When the fluctuation information includes one of the fluctuation frequency, the attenuation coefficient, and the amplitude, the fluctuation information can indicate a fluctuation component at each measurement site. By using the fluctuation information, it is possible to indicate a similar fluctuation component.

FIG. 8 is a diagram illustrating concept of an importance.

Here, $J_{ijk}$ is assumed to be an importance of fluctuation information j and measurement type k at a measurement site i, $x_{ijk}$ is assumed to be measurement information regarding the measurement type k on the basis of the fluctuation information j in the measurement site i, t1 and t2 (where t1<t2) is assumed to be a preliminarily designated time, $B_{ijk}$ is assumed to be an amplitude of the fluctuation calculated with Equation 13, and $\sigma_{ijk}$ is assumed to be an attenuation coefficient calculated with Equation 8. The similarity calculation unit 14 calculates the importance $J_{ijk}$ of each piece of fluctuation information from Equation 14.

$$J_{ijk} = \int_{t1}^{t2} |B_{ijk}\exp(\sigma_{ijk}t)|dt$$
$$= \frac{|B_{ijk}|\{\exp(\sigma_{ijk}t_2) - \exp(\sigma_{ijk}t_i)\}}{\sigma_{ijk}}$$

Equation 14

Here, when 0 is defined as a time serving an analysis reference and 0>t2>t1 is set, an importance of previous fluctuation information from the analysis reference time is calculated. Similarly, when t2>0>t1 is set, an importance of current fluctuation information including the analysis reference time is calculated. Further, when t2>t1>0 is set, an importance of future fluctuation information after the analysis reference time is calculated. For example, by setting t2>t1>0, it is possible to predict a time change of a future fluctuation component in a certain measurement site, calculate an importance on the basis of the predicted fluctuation component, and determine whether the measurement site is unstable in the future on the basis of the importance. By using the amplitude and the attenuation coefficient for the importance, it is possible to predict a future importance.

When the importance $J_{ijk}$ is calculated in accordance with the definition of Equation 15, an importance of the fluctuation information in which the amplitude $B_{ijk}$ is large and the attenuation coefficient $\sigma_{ijk}$ is bad (the attenuation coefficient $\sigma_{ijk}$ is large) is increased. Here, instead of the importance by Equation 15, a value of the amplitude $B_{ijk}$ or the attenuation coefficient $\sigma_{ijk}$ may be defined as an importance.

FIG. 9 is a diagram illustrating a fluctuation information table.

The fluctuation information table has an entry for each piece of fluctuation information. An entry corresponding to one piece of fluctuation information includes fluctuation identification information (a fluctuation name in the drawing) for identifying the fluctuation information and fluctuation characteristics indicating the characteristics of the fluctuation indicated by the fluctuation information. The fluctuation identification information includes a name of a measurement site corresponding to input data and a fluctuation information number (No.) indicating a mode (degree) of the fluctuation information. In a case in which the fluctuation information is calculated using the foregoing prony method, fluctuation information with the same degree as the mode degree n is calculated in regard to one type of measurement information in one measurement site. Accordingly, in a case in which q types of (q≥1) measurement information are used in each site of p sites (p≥1), n×p×q pieces of fluctuation information are calculated. The fluctuation characteristics include the calculated fluctuation frequency, attenuation coefficient, amplitude, initial phase, and importance.

Here, the description will return to the information interpolation process.

After S32, the similarity calculation unit 14 performs a similarity calculation process of calculating similarity between pieces of fluctuation information of two measurement sites included in the site group on the basis of the fluctuation information calculated by the feature amount calculation unit 12 and the site group decided by the site group decision unit 13 (S33).

FIG. 10 is a diagram illustrating a similarity calculation process.

First, the similarity calculation unit 14 selects one of the site groups decided by the site group decision unit 13 and selects two sites from the measurement sites in the selected site group (S81). In the following description, the selected two sites are referred to as sites 1 and 2.

Next, the similarity calculation unit 14 selects one piece of fluctuation information of the site 1 as first fluctuation information, selects similar fluctuation information to the selected fluctuation information of the site 1 among the pieces of fluctuation information of the site 2 as second fluctuation information, and calculates similarity between the first fluctuation information and the second fluctuation information on the basis of the feature amount included in the fluctuation information (S82).

The similarity calculation unit 14 selects fluctuation information of the site 2 satisfying a required condition with respect to the first fluctuation information as second fluctuation information candidates. The required condition is, for example, a condition in which a difference in the fluctuation frequency is less than a pre-decided fluctuation frequency difference threshold between the first fluctuation information and the fluctuation information of the site 2 and a difference in the attenuation coefficient is less than a pre-decided attenuation coefficient difference threshold. Further the similarity calculation unit 14 selects one piece of second fluctuation information from second fluctuation information candidates. For example, the similarity calculation unit 14 selects a second fluctuation information candidate, in which the difference in the fluctuation frequency and the difference in the value of the attenuation coefficient are the minimum between the first fluctuation information and the second fluctuation information candidate, as the second fluctuation information from the second fluctuation information candidates.

Single similarity is a value that is calculated in a combination of the first fluctuation information and the second fluctuation information similar to the first fluctuation information and indicates the magnitude of the fluctuation. For example, the similarity calculation unit 14 calculates a sum of the first fluctuation information calculated in S32 and the importance of the second fluctuation information as similarity. The similarity may be a product of the importances of the first fluctuation information and the second fluctuation information. According to such a similarity calculation method, the similarity increases when the importances of both the first fluctuation information and the second fluctuation information increase.

FIG. 11 is a diagram illustrating a similarity table.

In this example, fluctuation of No. 1 is present as fluctuation information with a fluctuation frequency of 0.18 in the measurement site PMU1. Further, in this example, the similarity calculation unit 14 selects the measurement site PMU1 as the site 1, selects fluctuation information of No. 1 in the measurement site PMU1, selects the measurement site PMU2 as the site 2, and selects fluctuation information of No. 2 in the measurement site PMU2. In the similarity table, the fluctuation information of the sites 1 and 2 each includes the fluctuation frequency, the attenuation coefficient, the amplitude, and the initial phase as feature amounts of the frequency components. Further, the fluctuation information of the site 2 includes differences in the feature amounts of the frequency components from the fluctuation information of the site 1. For example, it is indicated that the fluctuation frequency in the fluctuation of No. 1 in the measurement site PMU2 is 0.19 and a difference from the fluctuation frequency in the fluctuation of No. 1 in the measurement site PMU1 is +0.01. In a case in which the second fluctuation information candidate satisfying the required condition is not present in the first fluctuation information, the similarity table indicates that the second fluctuation information is not present in regard to the first fluctuation information. At this time, the value of the second fluctuation information is not stored and a hyphen "-" is stored in the similarity table. Further, similarity between the first fluctuation information and the second fluctuation information is stored in the similarity table.

Next, the similarity calculation unit 14 determines whether the process ends in regard to all pieces of fluctuation information in the site 1 selected in S81 (S83). When the similarity calculation unit 14 determines that the process does not end (No), the similarity calculation unit 14 repeats S82 in regard to the other fluctuation information in the site 1. When the similarity calculation unit 14 determines that the process ends (Yes), the similarity calculation unit 14 determines whether the process ends in all of the combinations of the fluctuation information of two sites in all of the site groups (S84). When the similarity calculation unit 14 determines that the process does not end (No), the similarity calculation unit 14 repeats S81, S82, and S83 in regard to other two sites. When the similarity calculation unit 14 determines that the process ends (Yes), the similarity calculation unit 14 ends this flow.

Through the foregoing process, the similarity between two sites is calculated.

Here, the description will return to the information interpolation process.

After S33, the information interpolation unit 15 performs an interpolation value calculation process of calculating an interpolation value using the similarity calculated by the similarity calculation unit 14 (S34).

Here, the interpolation value calculation process will be described.

FIG. 12 is a diagram illustrating the interpolation value calculation process.

First, the information interpolation unit 15 selects a target measurement site which is a measurement site in which an interpolation value is calculated (S101). For example, the information interpolation unit 15 calculates content rates which are numbers of deficient values and abnormal values in a measurement site to the number of measurement values in the measurement site and selects the measurement site in which the content rate exceeds a predetermined content rate threshold as the target measurement site. An operator may sometimes select the target measurement site and input the target measurement site to the measurement information monitoring device 200. Thus, the information interpolation unit 15 can select the measurement site in which measurement information satisfies a pre-decided abnormal condition and interpolate the measurement information.

Next, the information interpolation unit 15 sets a use condition in the interpolation value calculation process (S102). For example, the information interpolation unit 15 sets the number of pieces of fluctuation information used to calculate the interpolation value as the use condition. The information interpolation unit 15 may set a similarity lower limit value which is a lower limit value of the similarity as the use condition.

Next, the information interpolation unit 15 selects similar fluctuation information to the fluctuation information of the target measurement site selected in S101 (S103). For example, in a case in which the use condition is the number of pieces of fluctuation information, the information interpolation unit 15 sequentially selects the fluctuation information from the one having high similarity by the number of fluctuation information. In a case in which the use condition is the similarity lower limit value, the information interpolation unit 15 selects all of the pieces of fluctuation information in which the similarity is greater than the similarity lower limit value.

Next, the information interpolation unit 15 calculates the interpolation value from the similar fluctuation information using the fluctuation information selected in S103 (S104). At this time, the information interpolation unit 15 calculates the interpolation value on the basis of the following equation.

$$y(t) = \sum_i R_i \exp(j\theta_i)\exp((\sigma_i + 2\pi f_i)t) \qquad \text{Equation 15}$$

Here, y(t) is an interpolation value, t is a time, i is an index of the similar fluctuation information selected in S103, $R_i$ is an amplitude of the fluctuation information i, $\theta_i$ is an initial phase of the fluctuation information i, $\sigma_i$ is an attenuation coefficient of the fluctuation information i, and $f_i$ is a fluctuation frequency of the fluctuation information i. That is, By expressing the measurement information of the target measurement site using similar frequency components, it is possible to interpolate the measurement information of the target measurement site at any time. By selecting the fluctuation information in which the similarity to the fluctuation information of the target measurement site satisfies a pre-decided similarity condition and calculating the measurement information of the measurement information of the target measurement site at a specific time, it is possible to improve calculation precision based on the selected fluctuation information. Here, the fluctuation information satisfying the similarity condition is fluctuation information from fluctuation information with high similarity to the number of pieces of fluctuation information or fluctuation information in which the similarity is equal to or greater than the similarity lower limit value.

Hereinafter, a display screen of the measurement information monitoring device 200 will be described.

FIG. 13 is a diagram illustrating a display screen.

The information interpolation unit 15 displays a display screen on the display device 202. The display screen includes a system diagram display portion 410 disposed on a left field, a fluctuation information display portion 420 disposed in an upper right field, and a time-series display portion 430 disposed in a lower right field.

In the system diagram display portion 410, the measurement sites included in the site group decided in S31 are displayed on a system diagram. In the example, measurement sites PMU1 to PMU5 are displayed in the system diagram display portion 410. Further, the system diagram display portion 410 indicates a combination of similar measurement sites in a region surrounded by a dotted line or a one-dot chain line on the basis of the fluctuation information calculated in S32 and the similarity between the measurement sites calculated in S33. In this case, PMU1, PMU2, and PMU3 are indicated as a combination of similar measurement sites and PMU1, PMU3, and PMU5 are indicated as a combination of similar measurement sites. The combination of similar measurement sites may be a combination of the fluctuation information satisfying a similarity condition, may indicate that a difference between the fluctuation information is less than a pre-decided threshold, or may be included in one site group. According to such display, the operator can confirm, for example, the site group, the similar measurement sites, or measurement sites used for interpolation.

In the fluctuation information display portion 420, the details of the fluctuation information calculated in S32 or the similarity between the measurement sites calculated in S33 and ground fault or short-circuit breakdown information or electric power generator failure information generated in a neighborhood district affecting a wide-area fluctuation phenomenon are displayed. The fluctuation information with a high importance calculated in S32 is preferentially displayed in the fluctuation information display portion 420.

In the time-series display portion 430, time-series measurement information before interpolation of the target measurement site and time-series measurement information after interpolation are displayed on a graph. The time-series measurement information before interpolation includes, for example, a deficient value or an abnormal value. One of recent information and previous information is selected as a display period of time of the time-series measurement information by the operator. The target measurement site may be selected by the operator or may be selected on the basis of a content rate of a deficient value or an abnormal value by the information interpolation unit 15. Time-series data of the fluctuation frequency and the attenuation coefficient included in the fluctuation information may be displayed in the time-series display portion 430. According to such display, the operator can confirm that the measurement information before interpolation is interpolated.

Hereinafter, a modification example of the importance calculation method by the feature amount calculation unit 12 will be described.

In S32 described above, the feature amount calculation unit 12 may select previous fluctuation information corresponding to a situation of the measurement site group of the current fluctuation information among the pieces of previous fluctuation information with reference to the previous fluctuation information and may calculate the importance $J_{ijk}$ in consideration of a duration time of the fluctuation components of the selected previous fluctuation information. For example, in a case in which a period in which fluctuation components with the same fluctuation frequency are continued is equal to or greater than a pre-decided period threshold in the previous fluctuation information, the feature amount calculation unit 12 sets the calculated importance $J_{ijk}$ to be larger. In a case in which the period in which fluctuation components with the same fluctuation frequency are continued is equal to or less than the pre-decided period threshold in the previous fluctuation information, the feature amount calculation unit 12 sets the calculated importance $J_{ijk}$ be smaller. By deciding the importance $J_{ijk}$ in this way, it is possible to exclude fluctuation by an influence of noise instantaneously contained in system fluctuation and preferentially monitor stationarily present fluctuation components.

FIG. 14 is a diagram illustrating a previous fluctuation information table.

The previous fluctuation information table has an entry for each case. The entry of one case includes case details indicating a case and at least one piece of fluctuation information corresponding to the case. The case details include a time, a date or a day of week, a month, or a season, and an event type. The fluctuation information includes a fluctuation number, a fluctuation frequency, an importance, a measurement site, an attenuation coefficient, an amplitude, and an initial phase.

The feature amount calculation unit 12 classifies the previous fluctuation information for each case and stores statistically processed information as previous fluctuation information in the information storage unit 30. The feature amount calculation unit 12 sets a case on the basis of information regarding a time point, a date, a day of week, a month, a season, and an event type of the measurement information used to calculate the fluctuation information.

The feature amount calculation unit 12 can reflect an influence of a variation in a flow situation in the system in a day to a statistical process for the fluctuation information by setting a case using a time. In this case, a variation in the flow situation is caused by living activities in a day for which a working period of time partitioned to arrival and leaving times in the morning and evening is an example. In the example of the drawing, 8:00 to 10:00 are set in case No. 1 and 12:00 to 14:00 are set in case No. 2.

The feature amount calculation unit 12 can reflect an influence of a variation in the flow situation in the system in a week by setting a case using a date or a day of week to a statistical process for the fluctuation information. The variation in the flow situation in this case is caused by living activities of each day of week for which a weekday or a holiday is an example. In the example of the drawing, Saturday and Sunday are set in case No. 1 and Monday to Friday are set in case No. 2.

The feature amount calculation unit 12 can reflect an influence of a variation in the flow situation in the system in a year by setting a case using a month or a season to the statistical process for the fluctuation information. The variation in the flow situation in this case is caused by living activities of each month or season for which a cooling demand in a summer season or a heating demand in a winter season is an example. In the example of the drawing, March to May are set in case No. 1 and July to September are set in case No. 2.

The feature amount calculation unit 12 can reflect an influence of a variation in the flow situation in the system by an event such as system breakdown or system switch by setting a case using an event type to the statistical process for the fluctuation information. In the example of the drawing, there is no event in case No. 1 and 1 LG of the node AA is set in case No. 2.

The feature amount calculation unit 12 may set a case in which a flow amount of a node or a power transmission line set as a monitoring target preliminarily, an electric power amount of an electric power generator, and weather information including division of sunshine, cloud, and rain or temperature information as classification items in addition to the setting method of the foregoing case and may perform the statistical process for the fluctuation information.

Here, a previous fluctuation information calculation process of calculating previous fluctuation information by the feature amount calculation unit 12 will be described.

FIG. 15 is a diagram illustrating a previous fluctuation information calculation process.

First, the feature amount calculation unit 12 stores measurement information of a plurality of time points (S141).

Next, the feature amount calculation unit 12 calculates fluctuation information at the plurality of time points and importances of the fluctuation information using the stored measurement information (S142). At this time, the feature amount calculation unit 12 calculates the fluctuation information and the importances in accordance with the processes of S31 to S33 described above.

Next, the feature amount calculation unit 12 sets classification of cases (S143). At this time, the feature amount calculation unit 12 uses at least one piece of information among the information regarding a time, a date, a day of week, a month, a season, and an event type indicated in the previous fluctuation information as classification items. The feature amount calculation unit 12 decides a starting end and a termination end of a period, a classification name of the event type, or a minimum value and a maximum value of numerical value information for each classification item to be used and sets classification division.

Next, the feature amount calculation unit 12 calculates the fluctuation information and the importance of each case on the basis of the classification of the case set in S143 (S144). At this time, the feature amount calculation unit 12 classifies an analysis time at which the fluctuation information and the importance are calculated in S142 for each case and sets representative values calculated by performing the statistical process on information regarding the fluctuation information and the importance at the plurality of times classified in the same case as the fluctuation information and the importance of each case. The feature amount calculation unit 12 uses an average value or a median value of each importance and fluctuation information as a representative value.

The previous fluctuation information calculation process has been described. In the importance calculation process, the feature amount calculation unit 12 may extract a case which is the closest to a situation of an electric power system at the analysis time as a case corresponding to the situation of the electric power system at the analysis time with reference to the previous fluctuation information calculated through the previous fluctuation information calculation process and may apply the importance of the extracted case. The feature amount calculation unit 12 can exclude the fluctuation affected by instantaneous noise contained in system fluctuation at the analysis time using a statistical process result of the previous fluctuation information and can accurately select the fluctuation components to be preferentially monitored.

According to the foregoing embodiment, even in a case in which a plurality of fluctuation components with close fluctuation frequencies are present simultaneously, other fluctuation components can be distinguished from each other and stable determination can be performed for each fluctuation component by extracting a plurality of related measurement sites on the basis of the electrical distance between the measurement sites. Therefore, it is possible to realize stable determination at a high speed and with high precision.

Terms for expressing the invention will be described. The measurement information monitoring device 200 or the like may be used an electric power system monitoring device. The measurement device 21 or the like may be used as a measurement device. The storage device 206 or the like may be used as a storage unit. The communication means 203 or the like may be used as a reception unit. The system state calculation unit 10 or the like may be used as a computation unit. The facility information DB or the like may be used as facility information. The information communication network 108 or the like may be used as a communication line. The display device 202 or the like may be used as a display device. The measurement information monitoring device 200 or the like may be used as a monitoring device. The measurement information monitoring system or the like may be used as an electric power system monitoring system.

REFERENCE SIGNS LIST

10 system state calculation unit
11 measurement information collection unit
12 feature amount calculation unit
13 site group decision unit
14 similarity calculation unit
15 information interpolation unit
20 system measurement unit
21 measurement device
30 information storage unit
101 electric power generator
102 electric power substation
103 a phase modifier
104 electric power load
105 external electric power system
108 information communication network
200 measurement information monitoring device

The invention claimed is:

1. An electric power system monitoring device that monitors an electric power system state, comprising:
 a measurement device disposed at each of a plurality of measurement sites in an electric power system;
 a storage unit that stores facility information indicating a position relationship of the plurality of measurement sites in the electric power system;
 a reception unit that receives time-series measurement information measured by the measurement device disposed at each of the plurality of measurement sites;
 a computation unit that acquires an electrical distance between the plurality of measurement sites on the basis of the facility information, classifies the plurality of measurement sites into at least one measurement site group on the basis of the electrical distance, extracts a frequency component of electric power fluctuation from the measurement information with respect to each of the measurement sites in the measurement site group, selects a second frequency component which is a frequency component of a second measurement site in the measurement site group with respect to a first frequency component which is a frequency component of a first measurement site in the measurement site group, and calculates a similarity between the first frequency component and the second frequency component; and
 a user interface through which a user controls operation of the electric power system monitoring device;
 wherein the facility information indicates at least one of a latitude and longitude of each of the plurality of measurement sites, a topology between the plurality of measurement sites, impedance between the plurality of measurement sites, and a feature of an electric power device linked to a vicinity of each of the plurality of measurement sites.

2. The electric power system monitoring device according to claim 1,
 wherein the computation unit calculates at least one of a fluctuation frequency, an attenuation coefficient, and an amplitude of the frequency component as a feature amount, compares a feature amount of the first frequency component to feature amounts of sites other than the first measurement site in the measurement site group, and selects the second frequency component among the sites other than the first measurement site in the measurement site group on the basis of a comparison result.

3. The electric power system monitoring device according to claim 2,
 wherein in a case in which the similarity between the first frequency component and the second frequency component satisfies a pre-decided similarity condition, the computation unit calculates measurement information regarding a specific time of the first measurement site on the basis of a feature amount of the second frequency component.

4. The electric power system monitoring device according to claim 3,
wherein the computation unit calculates an importance indicating a magnitude of influence of the frequency component on stability of the electric power system with respect to each frequency component of each measurement site in the measurement site group on the basis of the feature amount and calculates the similarity between the first frequency component and the second frequency component on the basis of the importance of the first frequency component and the importance of the second frequency component.

5. The electric power system monitoring device according to claim 4,
wherein the computation unit selects a measurement site in which abnormality in the measurement information satisfies a predetermined abnormality condition in the measurement site group as the first measurement site.

6. The electric power system monitoring device according to claim 4,
wherein the storage unit stores importances of a plurality of previous fluctuation frequency components, and
wherein the computation unit selects the importance corresponding to a situation of the electric power system among the importances of the plurality of previous fluctuation frequency components and calculates the importance of each frequency component on the basis of the selected importance.

7. The electric power system monitoring device according to claim 1,
wherein in the computation unit, the electrical distance between two measurement sites among the plurality of measurement sites is proportional to an impedance between the two measurement sites.

8. The electric power system monitoring device according to claim 1,
wherein on the basis of the facility information, the computation unit causes a display device to display a screen indicating the first measurement site and the second measurement site along with one of a system diagram and map of the electric power system.

9. An electric power system monitoring system that monitors an electric power system state, comprising:
a plurality of measurement devices that are respectively disposed at a plurality of measurement sites in the electric power system;
a monitoring device that is connected to the plurality of measurement devices via communication lines,
wherein the monitoring device includes
a storage unit that stores facility information indicating a position relationship of the plurality of measurement sites in the electric power system,
a reception unit that receives time-series measurement information measured by the measurement device disposed at each of the plurality of measurement sites, and
a computation unit that acquires an electrical distance between the plurality of measurement sites on the basis of the facility information, classifies the plurality of measurement sites into at least one measurement site group on the basis of the electrical distance, extracts a frequency component of electric power fluctuation from the measurement information with respect to each of the measurement sites in the measurement site group, selects a second frequency component which is a frequency component of a second measurement site in the measurement site group with respect to a first frequency component which is a frequency component of a first measurement site in the measurement site group, and calculates a similarity between the first frequency component and the second frequency component; and
a user interface through which a user controls operation of the monitoring device;
wherein the facility information indicates at least one of a latitude and longitude of each of the plurality of measurement sites, a topology between the plurality of measurement sites, impedance between the plurality of measurement sites, and a feature of an electric power device linked to a vicinity of each of the plurality of measurement sites.

* * * * *